(12) United States Patent
Somerville

(10) Patent No.: US 9,793,861 B1
(45) Date of Patent: Oct. 17, 2017

(54) AMPLIFICATION SYSTEMS

(71) Applicant: QUALCOMM Incorporated, San Diego, CA (US)

(72) Inventor: Thomas Somerville, Tempe, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/221,928

(22) Filed: Jul. 28, 2016

(51) Int. Cl.
H03F 3/45 (2006.01)
H03F 1/02 (2006.01)
H03F 1/34 (2006.01)

(52) U.S. Cl.
CPC .......... *H03F 1/0222* (2013.01); *H03F 1/342* (2013.01); *H03F 3/45179* (2013.01); *H03F 2200/102* (2013.01); *H03F 2200/462* (2013.01); *H03F 2200/78* (2013.01); *H03F 2203/45288* (2013.01)

(58) Field of Classification Search
CPC ......................................................... H03F 3/45
USPC ........................................ 330/260, 261, 127
See application file for complete search history.

(56) References Cited

U.S. PATENT DOCUMENTS

| 7,570,044 | B2 | 8/2009 | Takeda | |
|---|---|---|---|---|
| 7,898,332 | B2 | 3/2011 | Deguchi et al. | |
| 8,558,630 | B2* | 10/2013 | Souma | H03F 3/45 331/158 |
| 8,742,852 | B2* | 6/2014 | Sugimoto | H03F 3/087 330/252 |
| 8,981,847 | B2 | 3/2015 | Balteanu | |
| 9,136,807 | B2 | 9/2015 | Wurcer | |
| 9,294,042 | B2 | 3/2016 | Scott et al. | |
| 2011/0133841 | A1* | 6/2011 | Shifrin | H03F 3/45183 330/279 |
| 2012/0032740 | A1* | 2/2012 | Hara | H03G 3/3084 330/252 |
| 2017/0077883 | A1* | 3/2017 | Chang | H03F 3/45686 |

* cited by examiner

*Primary Examiner* — Henry Choe
(74) *Attorney, Agent, or Firm* — Patterson & Sheridan, L.L.P.

(57) ABSTRACT

Certain aspects of the present disclosure provide methods and apparatus for implementing an amplification system. The amplification system includes an amplifier comprising differential inputs and an output. The differential inputs include an inverting input and a non-inverting input. The amplification system further includes a feedback path from the output coupled to the inverting input. The feedback path from the output is coupled to at least one of an inverting amplifier or buffer, and the at least one of the inverting amplifier or buffer is further coupled to the non-inverting input.

10 Claims, 13 Drawing Sheets

AMPLIFICATION SYSTEMS

TECHNICAL FIELD

Certain aspects of the present disclosure generally relate to electronic circuits and, more particularly, to amplification systems.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Amplifiers (e.g., transimpedance amplifiers, inverting amplifiers, etc.) may be used in a variety of systems (which may be referred to as amplification systems) to increase the power of an input signal, including for wireless communication systems. For example, amplifiers may be used in radio frequency (RF) systems, to increase the power of a signal for transmission, or increase the power of a received signal.

Such RF systems may implement envelope tracking, which is an approach to amplifier design where the power supply voltage to the amplifier is adjusted so as to track the instant transmission power required for transmitting a signal. Accordingly, the amplifier may operate efficiently according to the varying required power level.

Amplifiers used in amplification systems may have an undesired output error. In particular, the actual output from the amplifier deviates from the desired output by the undesired output error.

SUMMARY

Certain aspects of the present disclosure provide an envelope tracking supply modulator. The envelope tracking supply modulator comprises an amplifier. The amplifier comprises differential inputs and an output. The differential inputs comprise an inverting input and a non-inverting input. The envelope tracking supply modulator further comprises a first node at the inverting input. The first node is coupled to a feedback path from the output. The envelope tracking supply modulator further comprises a second node at the non-inverting input. The second node is coupled to an inverting amplifier or buffer coupled to the first node. The second node is coupled to a reference voltage source.

Certain aspects of the present disclosure provide an amplification system. The amplification system comprises an amplifier comprising differential inputs and an output. The differential inputs comprise an inverting input and a non-inverting input. The amplification system further comprises a feedback path from the output coupled to the inverting input. The feedback path from the output is coupled to at least one of an inverting amplifier or buffer. The at least one of the inverting amplifier or buffer is further coupled to the non-inverting input.

Certain aspects of the present disclosure provide a method for reducing error in an amplification system. The method comprises generating, by an amplifier comprising an inverting input and a non-inverting input, an output signal comprising a sum of a nominal output signal and an output error signal, the output error signal being based on an input error signal of the amplifier. The method further comprises inverting the input error signal to generate an inverted input error signal. The method further comprises inputting the inverted input error signal to the non-inverting input.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
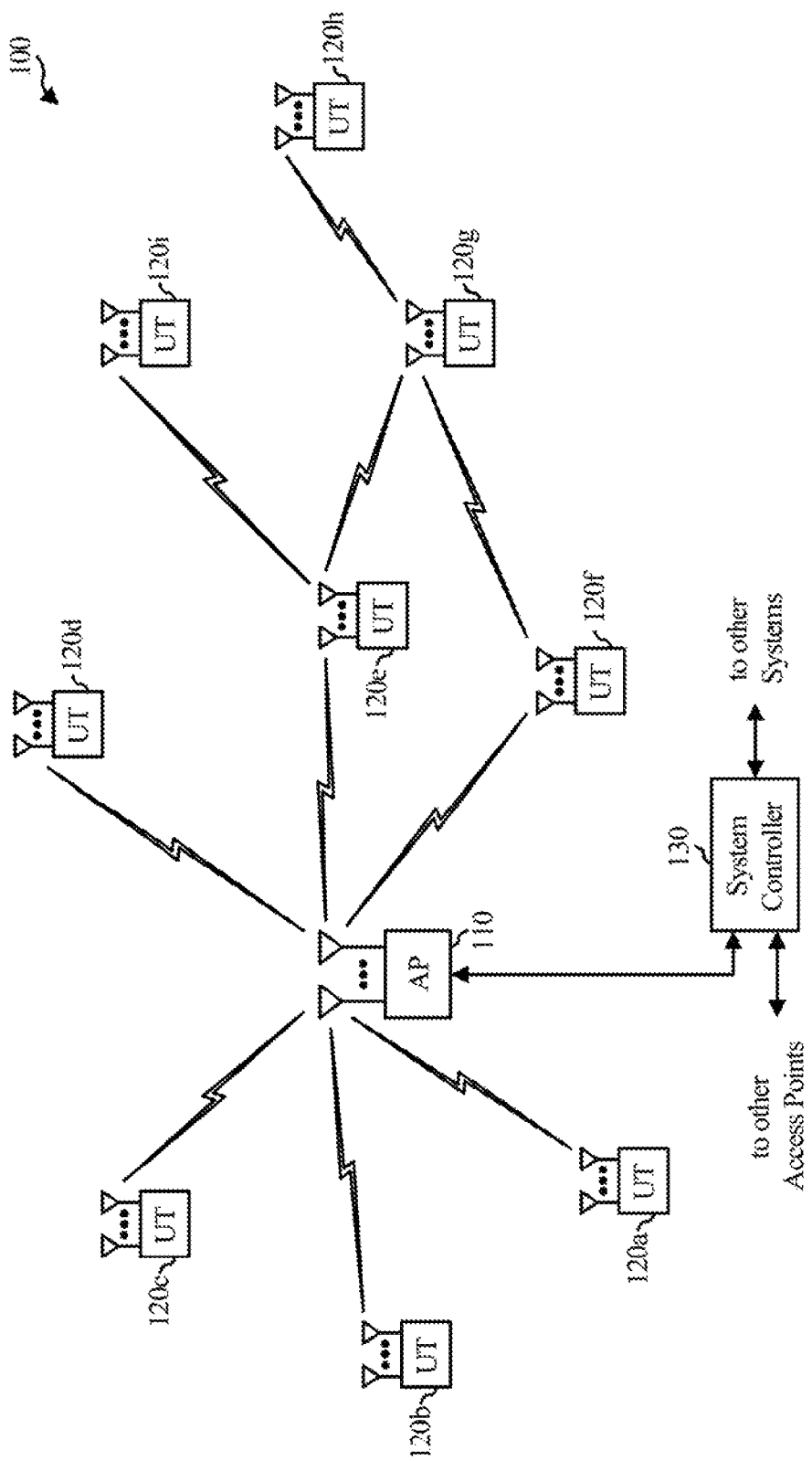
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more amplifiers to amplify signals. At least one of the amplifiers may be designed in accordance with certain aspects of the present disclosure.

Figure 2:
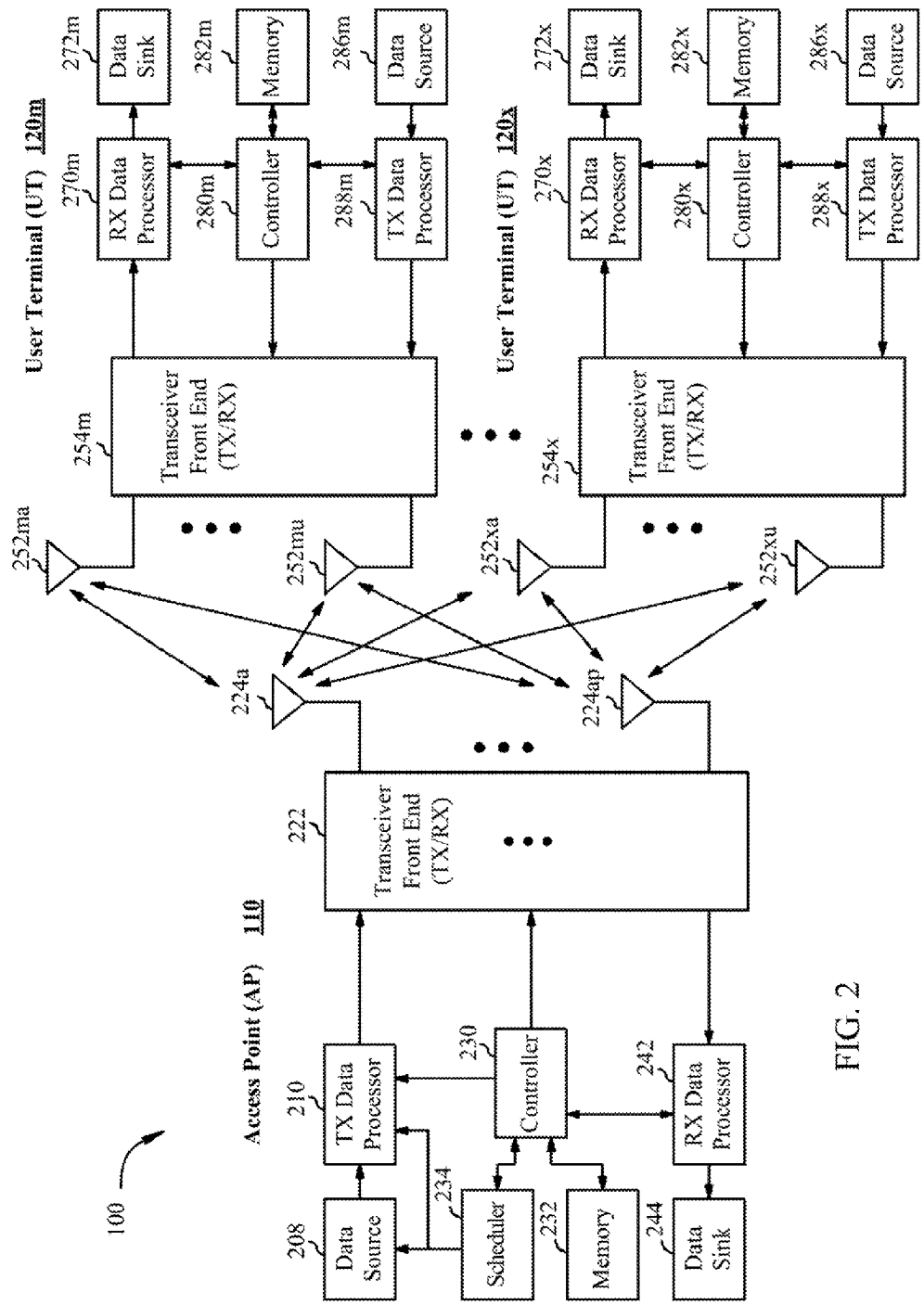
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more amplifiers to amplify signals. At least one of the amplifiers may be designed in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
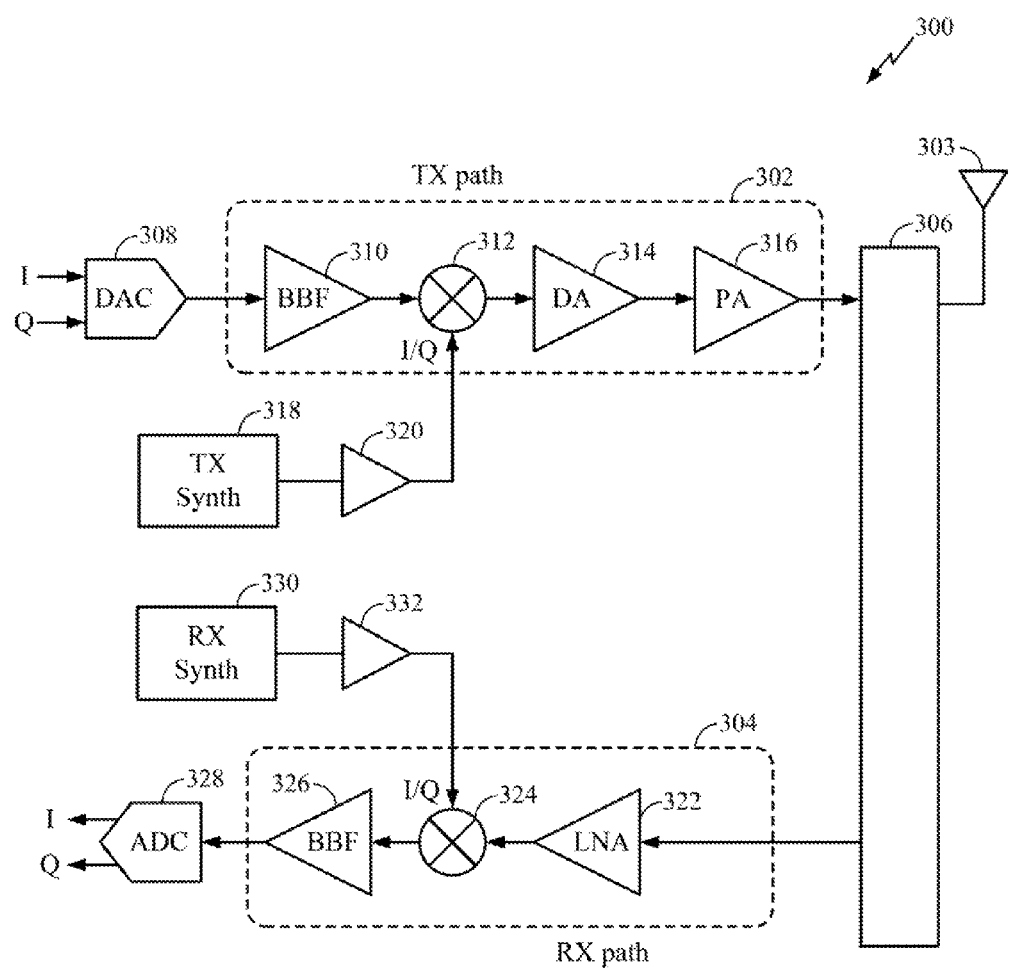
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

The PA 316 may be designed in accordance with certain aspects described herein. For example, the power supply to the PA 316 may comprise an envelope tracking supply modulator in accordance with certain aspects described herein. The envelope tracking supply modulator may be configured to adjust the power supply of the PA 316, such that the power supplied to the PA 316 is based on or tracks the envelope (e.g., envelope waveform) of the signal to be amplified by the PA 316.

An Example Amplification System

Certain aspects of the present disclosure generally relate to amplification systems. In particular, certain aspects of the present disclosure relate to designs for amplification systems that reduce the error of an output signal from the amplifier.

Amplifiers (e.g., transimpedance amplifiers, inverting amplifiers, etc.) may have an undesired output error (e.g., voltage, current). In particular, the actual output from the amplifier deviates from the desired output by the undesired output error.

Figure 4:
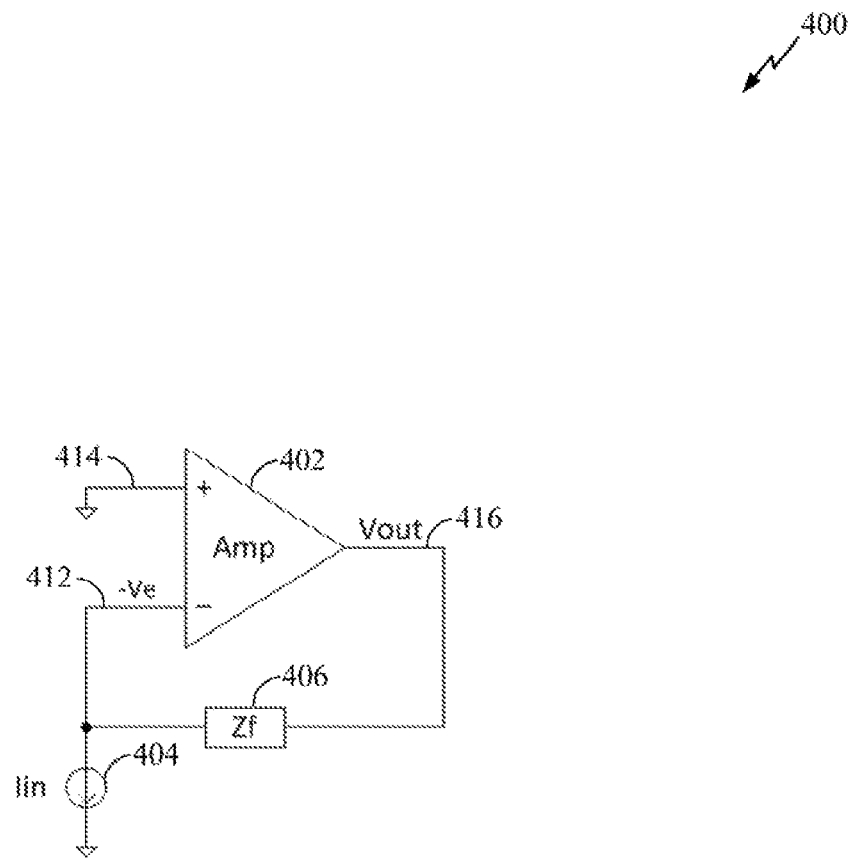
FIG. 4 illustrates a block diagram of an example of an amplification system including a transimpedance amplifier.

For example, FIG. 4 illustrates an example of an amplification system 400. The amplification system 400 may be configured to function as a transimpedance amplifier (e.g., current-to-voltage converter), as illustrated. As shown, the amplification system 400 includes an operational amplifier (op amp) 402, a current source 404, and a feedback path 406. It should be noted that other electrical components (e.g., load, capacitors, resistors, etc.) may be included in the amplification system 400 and/or may be coupled to the components described. For example, the impedance of the feedback path 406 may be characterized as $Z_F$. Such impedance may be used to characterize components along the feedback path (e.g., resistors, capacitors, etc.) in different configurations (e.g., serial, parallel, etc.).

As shown, the op amp 402 includes a differential input, including an inverting input 412 and a non-inverting input 414. The non-inverting input 414 may be coupled to a reference potential (e.g., electrical ground). Further, the inverting input 412 may be coupled to one end of the feedback path 406. The other end of the feedback path 406 may be coupled to an output 416 of the op amp 402. The current source 404 may further be coupled to the inverting input 412, and sink or source a current signal from or to the op amp 402.

The output voltage $V_{OUT}$ of the signal at the output 416 of the op amp 402, may be characterized by the following equation:

$$V_{OUT} = -V_e + I_{in} * Z_F,$$

where $I_{in} * Z_F$ is the nominal output voltage of the signal at the output 416 of the op amp 402, $I_{in}$ is the current signal sunk by the current source 404, $Z_F$ is the feedback impedance along the feedback path 406, and $V_e$ is the undesired output error voltage of the signal at the output 416 of the op amp 402.

$V_e$ may be characterized by the following equation:

$$V_e = V_{os} + V_n(f) + \frac{V_{OUT}}{A(f)},$$

where $V_{os}$ is the DC input offset voltage of the op amp 402, $V_n(f)$ is the input noise voltage of the op amp 402, $$\frac{V_{OUT}}{A(f)}$$

is distortion of the op amp 402, and $A(f)$ is the open-loop gain of the op amp 402.

With respect to FIG. 4, one end of the feedback path 406 may be coupled to the output 416 of the op amp 402, which generates a signal with output voltage $V_{OUT}$. $V_{OUT}$ represents the sum of the output error voltage ($-V_e$) and the voltage drop due to the current draw through the impedance $Z_F$ ($I_{in} * Z_F$). Accordingly, the voltage at the other end of the feedback path 406 (e.g., other end of the impedance $Z_F$ and coupled to the current source 404), may be indicative of the input-referred error voltage $V_e$ (e.g., the inverse of $V_e$, $-V_e$), which is indicative of the error associated with the op amp 402. In particular, the undesired output error voltage (with gain of the op amp applied) is based on the input-referred error voltage (without gain of the op amp applied). As discussed, the inverting input 412 may be coupled to this end of the feedback path 406 (signal with a voltage indicative of the input-referred error voltage $V_e$), as well as the current source 404.

Certain aspects of the present disclosure relate to designs for amplification systems that reduce the error (e.g., output error voltage) of an output signal (e.g., output voltage $V_{OUT}$) from the amplifier. In particular, in certain aspects, the non-inverting input of an amplifier in such an amplification system may be configured to receive an inverse of a signal based on the input signal to an inverting input of the amplifier. For example, the inverting input of the amplifier may be coupled to one end of a feedback path. The other end of the feedback path may be coupled to the output of the amplifier. At the output of the amplifier may be an output signal (e.g., with output voltage $V_{OUT}$) that has an output error voltage (e.g., $V_e$*gain of amplifier), such as discussed with respect to FIG. 4. The voltage at the end of the feedback path coupled to the inverting input of the amplifier may be indicative of the input-referred error voltage (e.g., $-V_e$). Accordingly, the non-inverting input of the amplifier may be coupled to a signal based on an inverse of the signal at the end of the feedback path (e.g., input-referred error voltage (e.g., $V_e$)), as opposed to the non-inverted signal (e.g., $-V_e$).

In particular, in certain aspects, an inverting buffer (or an inverting amplifier, or other suitable component configured to invert a signal) may be coupled between the inverting input of the amplifier and the non-inverting input of the amplifier, wherein an input of the inverting buffer may be coupled to the inverting input, and an output of the inverting buffer may be coupled to the non-inverting input. For example, a feedback path from the output of the amplifier, in addition to being coupled to the inverting input of the amplifier, may be coupled to the inverting buffer, which may be further coupled to the non-inverting input of the amplifier. It should be noted that any couplings described herein may refer to direct couplings (e.g., components directly coupled without intervening components) or indirect couplings (components with one or more other components coupled between them) so long as the resulting circuits still adhere to the principles described herein. Further, it should be noted that though the principles described herein are described with respect to particular types of amplifiers, they may be applied to other appropriate types of amplifiers as well.

Figure 5:
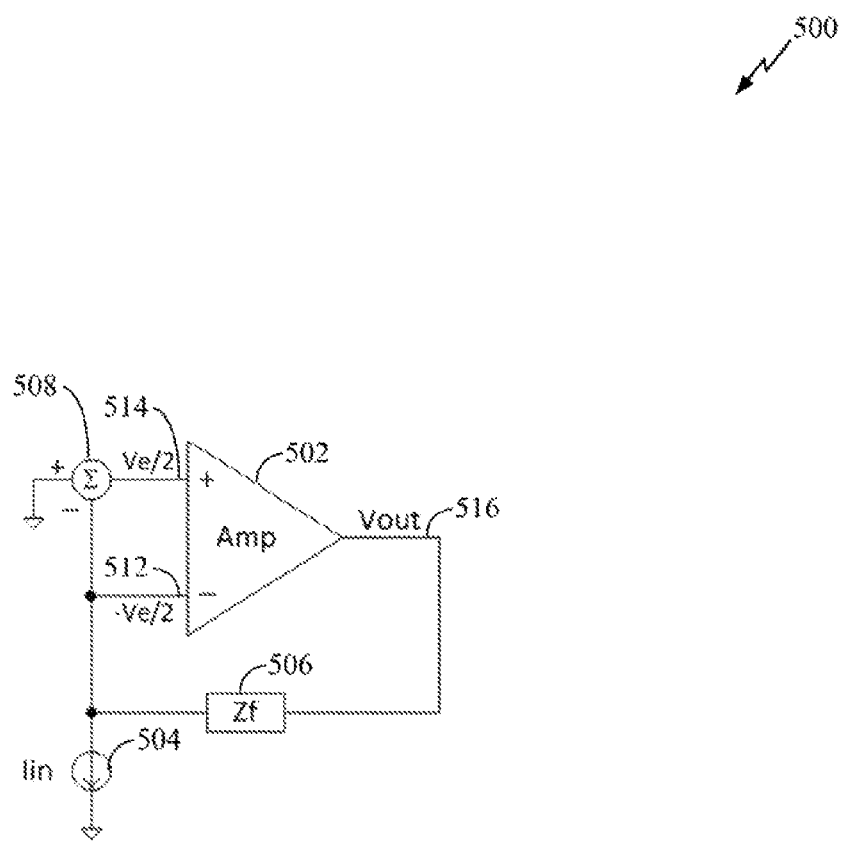
FIG. 5 illustrates a block diagram of an example of an amplification system to reduce error voltage of the output signal for a transimpedance amplifier.

For example, FIG. 5 illustrates an example of an amplification system 500 to reduce error voltage of the output signal for an amplifier. The amplification system 500 may be configured to function as a transimpedance amplifier. As shown, the amplification system 500 includes an op amp 502, a current source 504, and a feedback path 506. Additionally, the amplification system 500 includes a summer 508 (e.g., combiner, summer, etc.). It should be noted that, in certain aspects, other electrical components (e.g., load, capacitors, resistors, etc.) may be included in the amplification system 500 and/or may be coupled to the components described. For example, the impedance of the feedback path 506 may be characterized as $Z_F$. Such impedance may be used to characterize components (e.g., resistors, capacitors, etc.) along the feedback path in different configurations (e.g., serial, parallel, etc.).

As shown, the op amp 502 includes a differential input, including an inverting input 512 and a non-inverting input 514. The non-inverting input 514 may be coupled to the output of the summer 508. An input of the summer 508 may be coupled to a reference potential (e.g., electrical ground), and another input of the summer 508 may be coupled to one end of the feedback path 506. The summer 508 may be configured to combine (e.g., sum of the inverse)/subtract the signal at the end of the feedback path 506 from the reference potential to generate the signal applied to the non-inverting input 514. For example, the summer 508 may comprise an inverting buffer. The input of the inverting buffer may be coupled to the output of the feedback path 506 (and inverting input 512), and the output of the inverting buffer may be coupled to the non-inverting input 514 (e.g., between the non-inverting input 514 and the reference potential).

Further, the inverting input 512 may be coupled to the one end of the feedback path 506. The other end of the feedback path 506 may be coupled to an output 516 of the op amp 502. The current source 504 may further be coupled to the inverting input 512, and sink or source a current signal from or to the op amp 502.

The output voltage $V_{OUT}$ of the signal at the output 516 of the op amp 502, may be characterized by the following equation:

$$V_{OUT} = -V_e/2 + I_{in}*Z_F,$$

where $V_e/2$ is the undesired output error voltage of the signal at the output 516 of the op amp 502. In particular, the output error voltage $V_e/2$ is half of the output error voltage $V_e$ of the signal at the output 416 of the op amp 402 of FIG. 4. Accordingly, the additional feedback of the inverse of the signal on the feedback path 506 applied to the non-inverting input 514, halves the output error voltage of the op amp 502.

With respect to FIG. 5, one end of the feedback path 506 may be coupled to the output 516 of the op amp 502, which generates a signal with output voltage $V_{OUT}$. $V_{OUT}$ represents the sum of the error voltage ($-V_e/2$) and the voltage drop due to the current draw through the impedance $Z_F$ ($I_{in}*Z_F$). Accordingly, the voltage at the other end of the feedback path 506 (e.g., other end of the impedance $Z_F$ and coupled to the current source 504), may be indicative of the input-referred error voltage $V_e/2$ (e.g., the inverse of $V_e/2$, $-V_e/2$). As discussed, the inverting input 512 may be coupled to this end of the feedback path 506 (signal with a voltage indicative of the input-referred error voltage $V_e/2$), as well as the current source 504.

Figure 6:
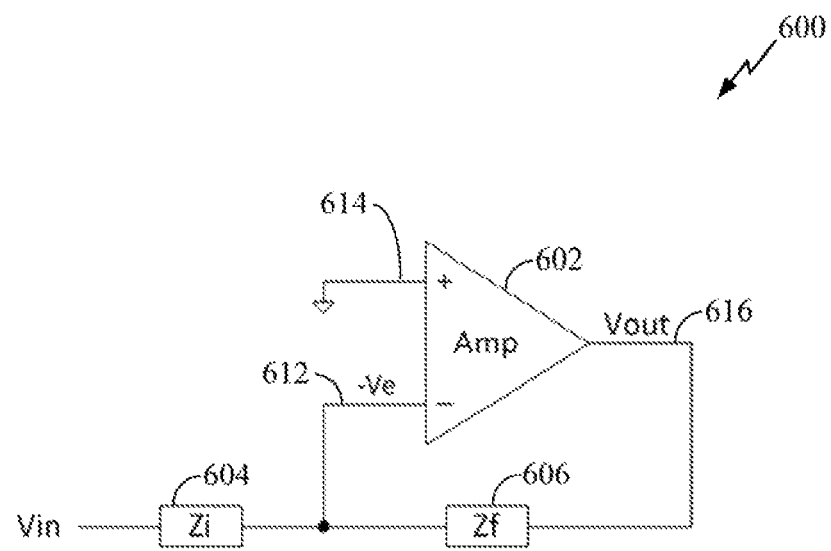
FIG. 6 illustrates a block diagram of an example of an amplification system including an inverting amplifier.

FIG. 6 illustrates an example of an amplification system 600. The amplification system 600 may be configured to function as an inverting amplifier. As shown, the amplification system 600 includes an op amp 602, an input path 604, and a feedback path 606. The input path 604 may be configured to receive, at an input terminal to the input path 604, an input signal (e.g., $V_{in}$), which may be supplied by another circuit (which may be characterized as a voltage source) coupled to the end of the input path 604. It should be noted that, in certain aspects, other electrical components (e.g., load, capacitors, resistors, etc.) may be included in the amplification system 600 and/or may be coupled to the components described. For example, the impedance of the feedback path 606 may be characterized as $Z_F$. Further, the impedance of the input path 604 may be characterized as $Z_i$. Such impedances may be used to characterize components (e.g., resistors, capacitors, etc.) along the feedback path or of the input path 604 in different configurations (e.g., serial, parallel, etc.).

As shown, the op amp 602 includes a differential input, including an inverting input 612 and a non-inverting input 614. The non-inverting input 614 may be coupled to a reference potential (e.g., electrical ground). Further, the inverting input 612 may be coupled to one end of the feedback path 606. The other end of the feedback path 606 may be coupled to an output 616 of the op amp 602. One end of the input path 604 may further be coupled to the inverting input 612, and provide an input signal voltage to the op amp 602.

The output voltage $V_{OUT}$ of the signal at the output 616 of the op amp 602, may be characterized by the following equation:

$$V_{OUT} = -V_e\left[1 + \left(\frac{Z_F}{Z_i}\right)\right] - V_{in}\left(\frac{Z_F}{Z_i}\right),$$

where $$-V_{in}\left(\frac{Z_F}{Z_i}\right)$$

is the nominal output voltage of the signal at the output 616 of the inverting amplifier 402, $V_{in}$ is the input signal voltage to the input terminal of the input path 604, $Z_F$ is the feedback impedance along the feedback path 606, $Z_i$ is the input impedance of the input path 604, and $$V_e\left[1 + \left(\frac{Z_F}{Z_i}\right)\right]$$

is the undesired output error voltage of the signal at the output 616 of the op amp 602.

The input-referred error voltage ($V_e$) may be characterized by the following equation:

$$V_e = V_{os} + V_n(f) + \frac{V_{OUT}}{A(f)},$$

where $V_{os}$ is the DC input offset voltage of the op amp 602, $V_n(f)$ is the input noise voltage of the op amp 602, $$\frac{V_{OUT}}{A(f)}$$

is distortion of the op amp 602, and $A(f)$ is the open-loop gain of the op amp 602.

With respect to FIG. 6, one end of the feedback path 606 may be coupled to the output 616 of the op amp 602, which generates a signal with output voltage $V_{OUT}$. $V_{OUT}$ represents the sum of the output error voltage (e.g., $$-V_e\left[1+\left(\frac{Z_F}{Z_i}\right)\right]$$

and the nominal output voltage (e.g., $$-V_{in}\left(\frac{Z_F}{Z_i}\right)$$

of the op amp 602. Accordingly, the voltage at the other end of the feedback path 606 (e.g., other end of the impedance $Z_F$ and coupled to the input path 604), may be indicative of the input-referred error voltage $V_e$ (e.g., the inverse of $V_e$, $-V_e$). As discussed, the inverting input 612 may be coupled to this end of the feedback path 606 (signal with a voltage indicative of the output error voltage $V_e$), as well as the input path 604.

Figure 7:
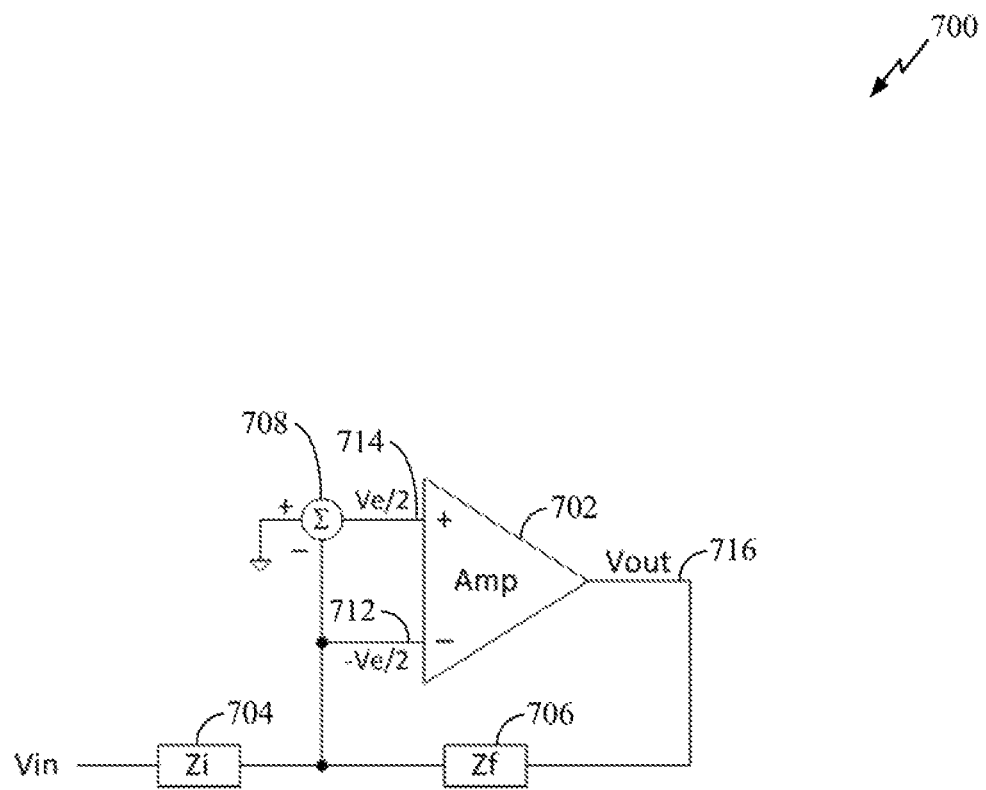
FIG. 7 illustrates a block diagram of an example of an amplification system to reduce error voltage of the output signal for an inverting amplifier.

FIG. 7 illustrates an example of an amplification system 700 to reduce error voltage of the output signal for an amplifier. The amplification system 700 may be configured to function as an inverting amplifier. As shown, the amplification system 700 includes an op amp 702, an input path 704, and a feedback path 706. The input path 704 may be configured to receive, at an input terminal to the input path 704, an input signal (e.g., $V_{in}$), which may be supplied by another circuit (which may be characterized as a voltage source) coupled to the end of the input path 704. Additionally, the amplification system 700 includes a summer 708 (e.g., combiner, summer, etc.). It should be noted that, in certain aspects, other electrical components (e.g., load, capacitors, resistors, etc.) may be included in the amplification system 700 and/or may be coupled to the components described. For example, the impedance of the feedback path 706 may be characterized as $Z_F$. Further, the impedance of the input path 704 may be characterized as $Z_i$. Such impedances may be used to characterize components (e.g., resistors, capacitors, etc.) along the feedback path 706 or of the input path 704 in different configurations (e.g., serial, parallel, etc.).

As shown, the op amp 702 includes a differential input, including an inverting input 712 and a non-inverting input 714. The non-inverting input 714 may be coupled to an output of the summer 708. An input of the summer 708 may be coupled to a reference potential (e.g., electrical ground), and another input of the summer 708 may be coupled to one end of the feedback path 706. The summer 708 may be configured to combine (e.g., sum of the inverse)/subtract the signal at the end of the feedback path 706 from the reference potential to generate the signal applied to the non-inverting input 714. For example, the summer 708 may comprise an inverting buffer. The input of the inverting buffer may be coupled to the output of the feedback path 706 (and inverting input 712), and the output of the inverting buffer may be coupled to the non-inverting input 714 (e.g., between the non-inverting input 714 and the reference potential).

Further, the inverting input 712 may be coupled to the one end of the feedback path 706. The other end of the feedback path 706 may be coupled to an output 716 of the op amp 702. One end of the input path 704 may further be coupled to the inverting input 712, and provide an input signal voltage to the op amp 702.

The output voltage $V_{OUT}$ of the signal at the output 716 of the op amp amplifier 702, may be characterized by the following equation:

$$V_{OUT}=-V_e\left[1+\left(\frac{Z_F}{Z_i}\right)\right]\Big/2-V_{in}\left(\frac{Z_F}{Z_i}\right),$$

where $$V_e\left[1+\left(\frac{Z_F}{Z_i}\right)\right]\Big/2$$

is the undesired output error voltage of the signal at the output 716 of the op amp 702. In particular, the output error voltage $$V_e\left[1+\left(\frac{Z_F}{Z_i}\right)\right]\Big/2$$

is half of the output error voltage $$V_e\left[1+\left(\frac{Z_F}{Z_i}\right)\right]$$

of the signal at the output 616 of the op amp 602 of FIG. 6. Accordingly, the additional feedback of the inverse of the signal on the feedback path 706 applied to the non-inverting input 714, halves the output error voltage of the op amp 702.

With respect to FIG. 7, one end of the feedback path 706 may be coupled to the output 716 of the op amp 702, which generates a signal with output voltage $V_{OUT}$. $V_{OUT}$ represents the sum of the output error voltage (e.g., $$-V_e\left[1+\left(\frac{Z_F}{Z_i}\right)\right]\Big/2$$

and the nominal output voltage (e.g., $$-V_{in}\left(\frac{Z_F}{Z_i}\right)$$

of the op amp 702. Accordingly, the voltage at the other end of the feedback path 706 (e.g., other end of the impedance $Z_F$ and coupled to the input path 704), may be indicative of the input-referred error voltage $V_e/2$ (e.g., the inverse of $V_e/2$, $-V_e/2$). As discussed, the inverting input 712 may be coupled to the this end of the feedback path 706 (signal with a voltage indicative of the input-referred error voltage $V_e/2$), as well as the input path 704.

Figure 8:
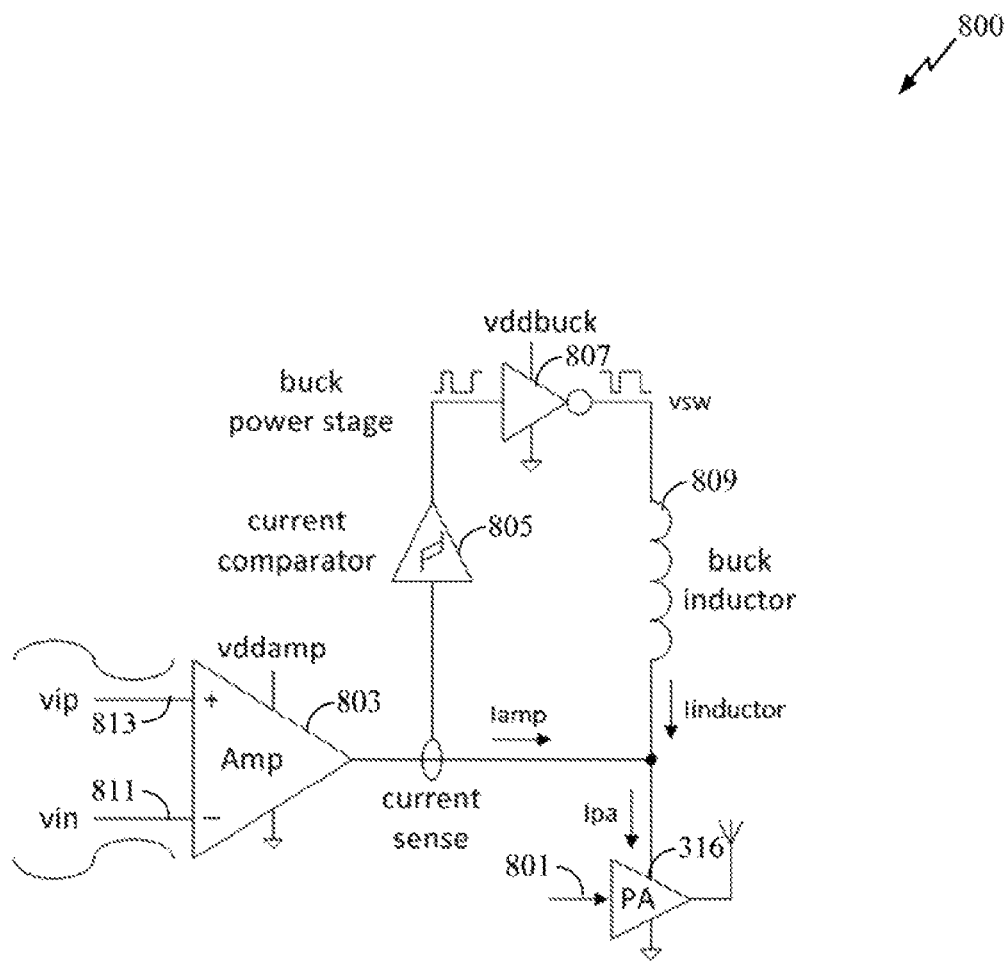
FIG. 8 illustrates a block diagram of an example envelope tracking supply modulator.

In certain aspects, the techniques described herein can also be applied to envelope tracking supply modulators to reduce the error at the output. Such envelope tracking supply modulators may be coupled to and used to generate the power supply (e.g., voltage or current) to an amplifier (e.g., PA 316) in a transmit path. For example, FIG. 8 illustrates a block diagram of an example envelope tracking supply modulator 800. As shown, the envelope tracking supply modulator 800 is coupled to and supplies power (e.g., Ipa) to the PA 316 of FIG. 3.

The envelope tracking supply modulator 800 comprises a transconductance amplifier 803, a current comparator 805, a power stage 807 (e.g., buck power stage), and an inductor (e.g., buck inductor) 809. The transconductance amplifier 803 includes a differential input, including an inverting input 811 and a non-inverting input 813. The inverting input 811 and non-inverting input 813 may be configured to receive differential input signals (e.g., $V_{ip}$ (positive signal) and $V_{in}$ (negative signal)) representing the envelope waveform of an input signal 801 to be amplified and transmitted by a PA (e.g., PA 316). For example, the inverting input 811 may be coupled to a path carrying the signal $V_{in}$, and the non-inverting input 813 may be coupled to a path carrying the signal $V_{ip}$. In certain aspects the inverting input 811 and non-inverting input 813 may be coupled to a DAC (e.g., DAC 308) configured to generate the input signal 801, on which signals $V_{ip}$ and $V_{in}$ are based.

As shown, the output of the transconductance amplifier 803 is coupled to and supplies power to a PA (e.g., PA 316). Further, an input of the current comparator 805 may be coupled via a current sensing mechanism to the output of the transconductance amplifier 803 and be configured to sense the current at the output of the transconductance amplifier 803. For example, the current comparator 805 may be configured to detect a zero current crossing at the output of the transconductance amplifier 803 and provide input to the power stage 807. Accordingly, an input of the power stage 807 may be coupled to an output of the current comparator 805. The signal from the current comparator 805, accordingly, may be used to control the power stage 807, such that the output signal of the power stage 807 is based on the signal from the current comparator 805.

The output of the power stage 807 may further be coupled to the inductor 809. The current slope at the inductor 809 may be based on the polarity of the output signal from the power stage 807. The inductor 809 may further be coupled to and supply a power supply to the PA 316. Accordingly, the power supplied to the PA 316 is a combination (Ipa) of the current signals output from the transconductance amplifier 803 (Iamp) and the inductor 809 (Iinductor), and based on an envelope waveform of the input signal 801 to be amplified and transmitted by the PA 316.

Figure 9:
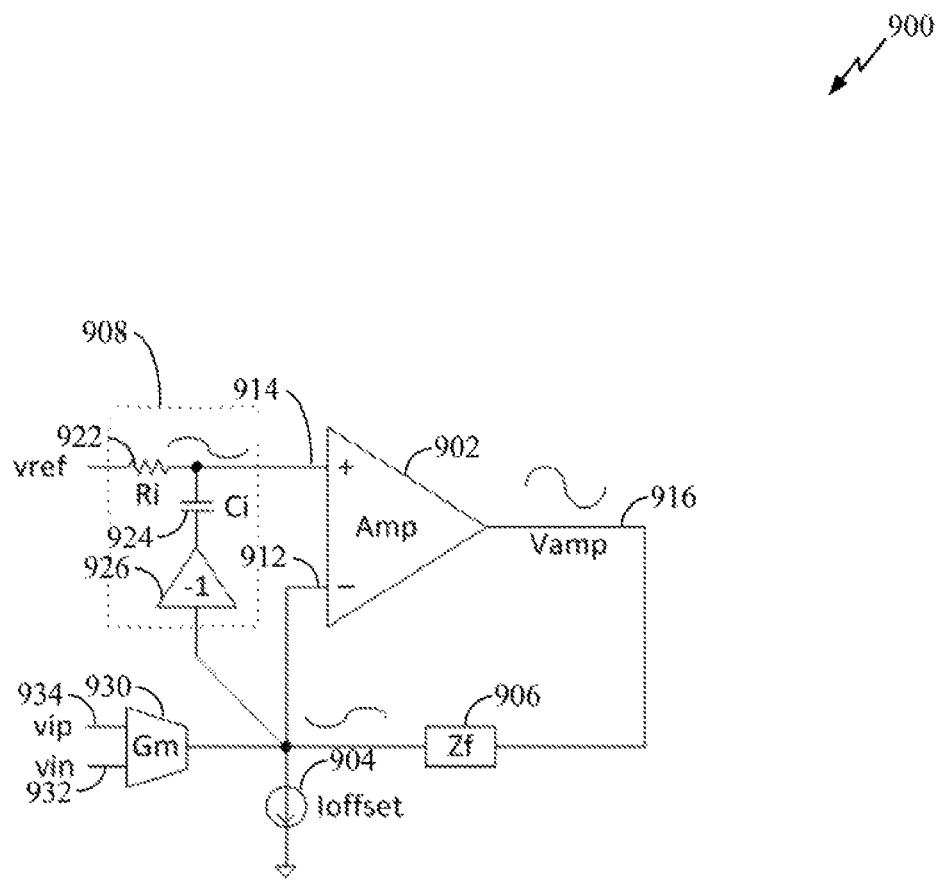
FIG. 9 illustrates a block diagram of an example of an envelope tracking supply modulator to reduce error voltage of the output signal.

FIG. 9 illustrates a block diagram of an example of an amplification system 900 to reduce error voltage of the output signal. The amplification system 900 may be configured to function as a transimpedance amplifier for an envelope tracking supply modulator. For example, the amplification system 900 may be used as the transimpedance amplifier 803 in the envelope tracking supply modulator 800. The output signal ($V_{amp}$) of the supply modulator 900 may be used as an envelope tracking power supply to an amplifier, such as PA 316 of FIG. 3.

As shown, the amplification system 900 includes an op amp 902, a current source 904, and a feedback path 906. Additionally, the amplification system 900 includes a resistor ($R_i$) 922, a capacitor ($C_i$) 924, an inverting buffer 926, and a $G_M$ block 930 (e.g., a transconductance amplifier (e.g., voltage-to-current converter)). It should be noted that other electrical components (e.g., load, capacitors, resistors, etc.) may be included in the amplification system 900 and/or may be coupled to the components described. For example, the impedance of the feedback path 906 may be characterized as $Z_F$. Such impedance may be used to characterize components along the feedback path 906 (e.g., resistors, capacitors, etc.) in different configurations (e.g., serial, parallel, etc.).

The $G_M$ block 930 includes an input (e.g., differential input), including a first input 932 (e.g., inverting input) and a second input 934 (e.g., non-inverting input). The first input 932 and second input 934 may be configured to receive differential input signals (e.g., $V_{ip}$ (positive signal) and $V_{in}$ (negative signal)) representing the envelope waveform of a signal to be amplified and transmitted by a PA (e.g., PA 316). For example, the first input 932 may be coupled to a path carrying the signal $V_{in}$, and the second input 934 may be coupled to a path carrying the signal $V_{ip}$. In certain aspects the first input 932 and second input 934 may be coupled to a DAC (e.g., DAC 308) configured to generate the input signal, on which the signals $V_{ip}$ and $V_{in}$ are based.

The output of the $G_M$ block 930 may be coupled to the current source 904. The current source 904 may be configured to generate a current $I_{offset}$, which is used to adjust a midpoint of the output voltage signal $V_{amp}$.

As shown, the op amp 902 includes a differential input, including an inverting input 912 and a non-inverting input 914. The non-inverting input 914 may be coupled to a path carrying the reference signal $V_{ref}$ and a path carrying an inverse of the signal at the inverting input 912. For example, the non-inverting input 914 may be coupled to a first terminal of the resistor 922 and a first terminal of the capacitor 924. A second terminal of the resistor 922 may further be coupled to a path carrying the reference signal $V_{ref}$. A second terminal of the capacitor 924 may further be coupled to the output of an inverting buffer 926. The input of the inverting buffer 926 may be coupled to the inverting input 912. The coupling of the non-inverting input 914, resistor 922, and capacitor 924, may be referred to as a non-inverting node.

Further, the inverting input 912 may be coupled to one end of the feedback path 906. The other end of the feedback path 906 may be coupled to an output 916 of the op amp 902. The current source 904 and the output of the $G_M$ block 930 may further be coupled to the inverting input 912, and sink or source a current signal from or to the op amp 902. The coupling of the feedback path 906, current source 904, $G_M$ block 930, inverting buffer 926, and the inverting input 912 may be referred to as a current summing node. In particular, the current sunk by or sourced from the current source 904 and $G_M$ block 930, and feedback path 906 may be summed at the current summing node.

With respect to FIG. 9, one end of the feedback path 906 may be coupled to the output 916 of the op amp 902, which generates a signal with output voltage $V_{amp}$. The voltage at the other end of the feedback path 906 (e.g., other end of the impedance $Z_F$ and coupled to the current source 904), may be indicative of the input-referred error voltage $V_e/2$. As discussed, the inverting input 912 may be coupled to this end of the feedback path 906.

In some aspects, the capacitor 924 is configured to couple the output of the inverting buffer 926, the input of which is coupled to the inverting input 912, to the non-inverting node and effectively modulate $V_{ref}$ with the inverted error signal (e.g., $-V_e/2$).

In certain aspects, the envelope waveform of a full scale positive signal to be amplified and transmitted by the PA 316 may be represented by $V_{ip}$=0.66 V and $V_{in}$=0.06 V. Further, the envelope waveform of a full scale negative signal to be amplified and transmitted by the PA 316 may be represented by $V_{in}$=0.66 V and $V_{ip}$=0.06 V. Accordingly, the full scale input of the PA 316 may be +/−0.6 V. Further, the output at the full scale input of the $G_M$ block 930 may be +/−2.4V. Accordingly, the gain of the $G_M$ block 930 may be 4.

The output of the op amp 902 may be characterized as follows:

$$V_{amp} = V_{ref} + 4(V_{ip} - V_{in}) + (I_{offset} * Z_F)$$

In certain aspects, the undesired component (e.g., error component) at the summing node (e.g., at the inverting input 912), may be reduced by ½ through the addition of the inverting buffer 926 as coupled. In addition, the op amp 902 may advantageously be in a gain=1 configuration for increasing closed loop bandwidth and decreasing noise. In particular, the addition of the inverting buffer 926 as coupled reduces the dynamic voltage at the summing node (e.g., at the inverting input 912) by adding the opposite phase signal (e.g., inverse signal) at the non-inverting input 914. The effects of the summing node parasitics are therefore reduced. Further, the amplification system 900 may have a high-pass corner frequency $(f_{hp})=1/2\pi R_i C_i$. Also, the distortion contributed by inverting buffer 926 may be reduced (e.g., by ~6 dB) as compared to other amplification systems without the addition of an inverting buffer 926 as coupled. Further, any increase in the wideband thermal noise of $V_{amp}$ may be small compared to the contribution by the $G_M$ block 930 and current source 904.

Figure 9A:
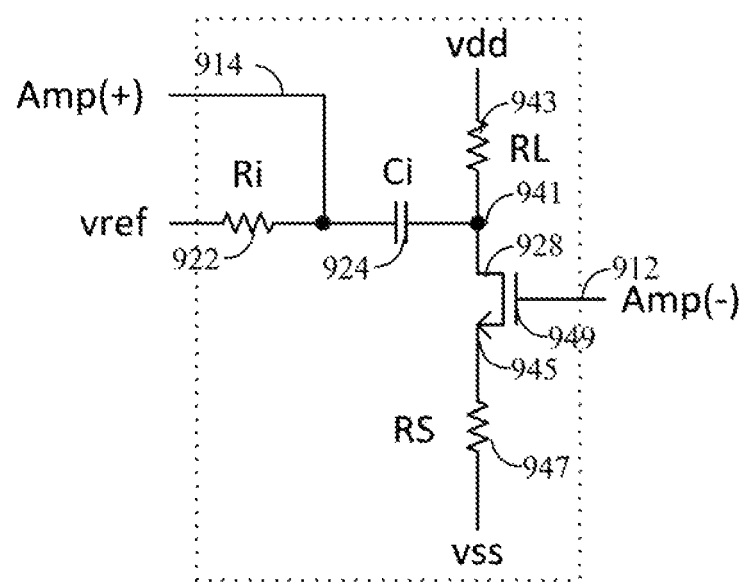
FIG. 9A illustrates a circuit diagram of an example implementation of an inverting buffer as an AC coupled inverting buffer.

FIG. 9A illustrates a circuit diagram of an example implementation of the inverting buffer 926 as an AC coupled inverting buffer. In certain aspects, the components shown in FIG. 9A may replace the resistor 922, capacitor 924, and inverting buffer 926 shown in FIG. 9.

The inverting buffer 926 may comprise a field-effect transistor (FET) 928. As shown, the non-inverting input 914 may be coupled to a first terminal of the resistor 922 and a first terminal of the capacitor 924. A second terminal of the resistor 922 may further be coupled to a path carrying the reference signal $V_{ref}$. A second terminal of the capacitor 924 may further be coupled to a drain terminal 941 of the FET 928. A source terminal 945 of the FET 928 may be coupled to a first terminal of a resistor ($R_s$) 947. A second terminal of the resistor 947 may be coupled to a path carrying a relatively lower supply voltage ($V_{ss}$) (e.g., ground or a negative voltage rail) to the FET 928. The drain terminal 941 may further be coupled to a first terminal of a resistor ($R_L$) 943. The second terminal of the resistor 943 may be coupled to a path carrying a relatively higher supply voltage ($V_{dd}$) (e.g., a positive voltage rail) to power the FET 928. A gate terminal 949 of the FET 928 may be coupled to the inverting input 912. It should be noted that the resistors $R_s$ and $R_L$ may not be actual resistors, but rather represent the resistance along the paths carrying the negative supply voltage and positive supply voltage, respectively.

According to the circuit diagram in FIG. 9A, the inverting buffer 926 may be configured to provide a wide bandwidth and have a gain=$-R_L/(R_s+1/g_m)$, where $g_m$ is the transconductance of the FET 928. Further, in certain aspects, the power supply rejection ratio (PSRR) of the inverting buffer 926 with respect to the supply voltage $V_{dd}$ may be 0 dB.

Figure 9B:
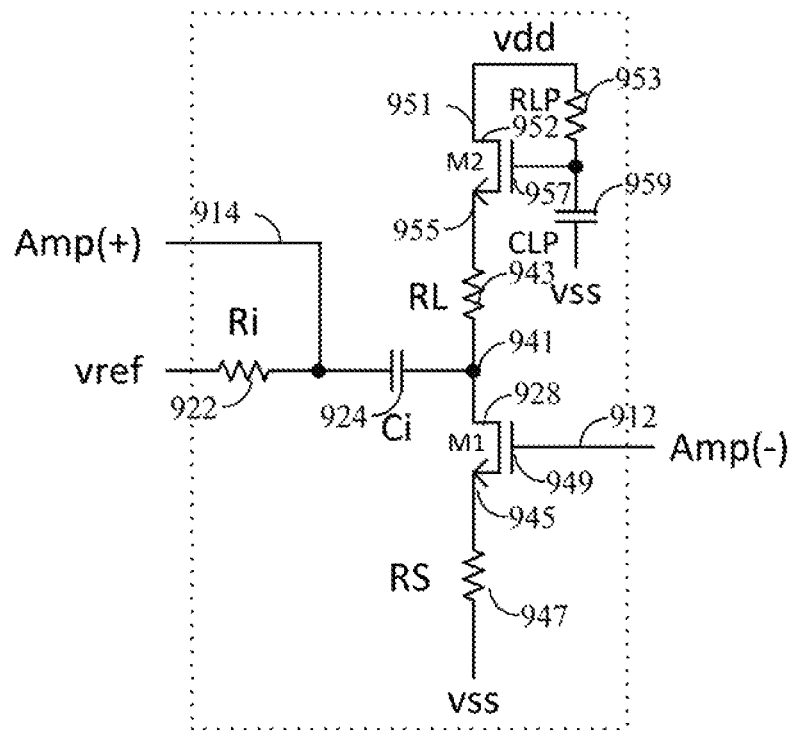
FIG. 9B illustrates a circuit diagram of another example implementation of an inverting buffer as an AC coupled inverting buffer.

FIG. 9B illustrates a circuit diagram of another example implementation of the inverting buffer 926 as an AC coupled inverting buffer. In certain aspects, the components shown in FIG. 9B may replace the resistor 922, capacitor 924, and inverting buffer 926 shown in FIG. 9.

The inverting buffer may comprise a field-effect transistor (FET) 928 and a FET 952. As shown, the non-inverting input 914 may be coupled to a first terminal of the resistor 922 and a first terminal of the capacitor 924. A second terminal of the resistor 922 may further be coupled to a path carrying the reference signal $V_{ref}$. A second terminal of the capacitor 924 may further be coupled to a drain terminal 941 of the FET 928. A source terminal 945 of the FET 928 may be coupled to a resistor ($R_s$) 947 which is coupled to a path carrying a relatively lower supply voltage ($V_{ss}$) (e.g., ground or a negative voltage rail) to the FET 928. The drain terminal 941 may further be coupled to a first terminal of a resistor ($R_L$) 943. A gate terminal 949 of the FET 928 may be coupled to the inverting input 912. It should be noted that the resistors $R_s$ and $R_L$ may not be actual resistors, but rather represent the resistance along the paths carrying the negative supply voltage and positive supply voltage, respectively, to the FET 928.

A second terminal of the resistor 943 (or drain terminal 941) may further be coupled to the source terminal 955 of the FET 952. The drain terminal 951 of the FET 952 may be coupled to a first terminal of a resistor ($R_{LP}$) 953. The first terminal of the resistor 953 may be coupled to a path carrying a relatively higher supply voltage ($V_{dd}$) (e.g., a positive voltage rail) to power the FET 952. It should be noted that the resistor $R_{LP}$ 953 may not be an actual resistor, but rather represent the resistance along the path carrying the positive supply voltage to the FET 952. A second terminal of the resistor 953 may further be coupled to the gate terminal 957 of the FET 952 and a first terminal of the capacitor ($C_{LP}$) 959. A second terminal of the capacitor 959 may further be coupled to the path carrying the supply voltage ($V_{ss}$) to the FET 928.

According to the circuit diagram in FIG. 9B, the inverting buffer 926 may be configured to provide a wide bandwidth and have a gain=$-(R_L+1/g_{m2})/(R_s+1/g_{m1})$, where $g_{m1}$ is the transconductance of the FET 928, and $g_{m2}$ is the transconductance of the FET 952. The gain of the inverting buffer 926 may equal −1, for $g_{m1}=g_{m2}$ and $R_L=R_s$. Further, in certain aspects, the PSRR of the inverting buffer 926 for the supply voltage $V_{dd}$ may be improved compared to the circuit diagram of FIG. 9A.

Figure 9C:
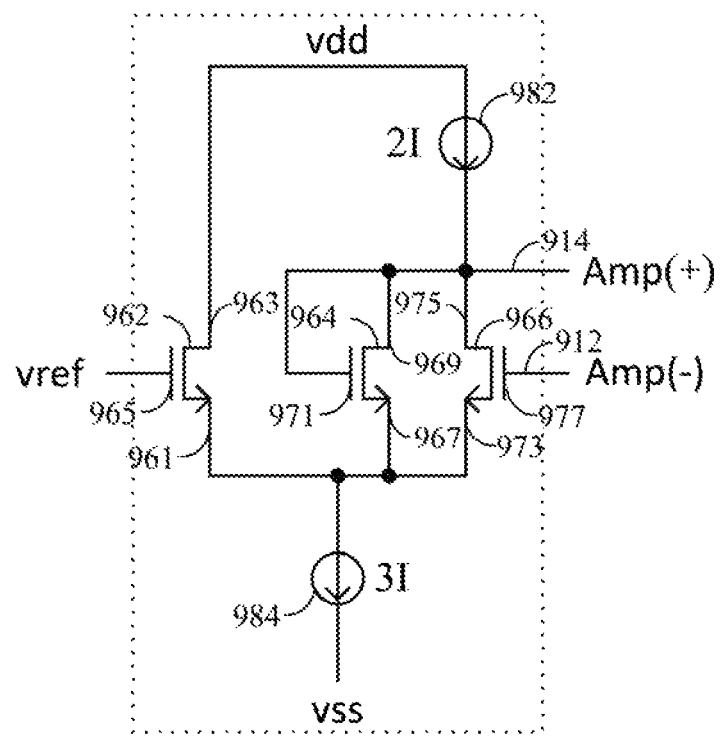
FIG. 9C illustrates a circuit diagram of another example implementation of an inverting buffer as a DC coupled two-phase buffer.

FIG. 9C illustrates a circuit diagram of another example implementation of the inverting buffer 926 as a DC coupled two-phase buffer. In certain aspects, the components shown in FIG. 9C may replace the resistor 922, capacitor 924, and inverting buffer 926 shown in FIG. 9.

As shown, the inverting buffer 926 may comprise a first FET 962, a second FET 964, and a third FET 966. The gate terminal 965 of the first FET 962 may be coupled to a path carrying the reference signal $V_{ref}$. The source terminal 961 of the first FET 962 may be coupled to a path including a current source 984 and carrying supply voltage $V_{ss}$ to the first FET 962. The drain terminal 963 of the first FET 962 may further be coupled to a path including a current source 982 and carrying supply voltage $V_{dd}$ to power the first FET 962. The current source 982 may further be coupled to the non-inverting input 914.

The source terminal 967 of the second power FET 964 may also be coupled to the path including the current source 984 and carrying the supply voltage $V_{ss}$. The gate terminal 971 and the drain terminal 969 of the second power FET 964 may be coupled to the non-inverting input 914.

The source terminal 973 of the third power FET 966 may also be coupled to the path including the current source 984 and carrying the supply voltage $V_{ss}$. The gate terminal 977 of the third power FET 966 may be coupled to the inverting input 912. The drain terminal 975 of the third power FET 966 may be coupled to the non-inverting input 914.

According to the circuit diagram in FIG. 9C, the gain of $V_{ref}$ to the non-inverting input 914 may be +1, and the gain of the inverting input 912 to the non-inverting input 914 may be −1, as desired.

Figure 10:
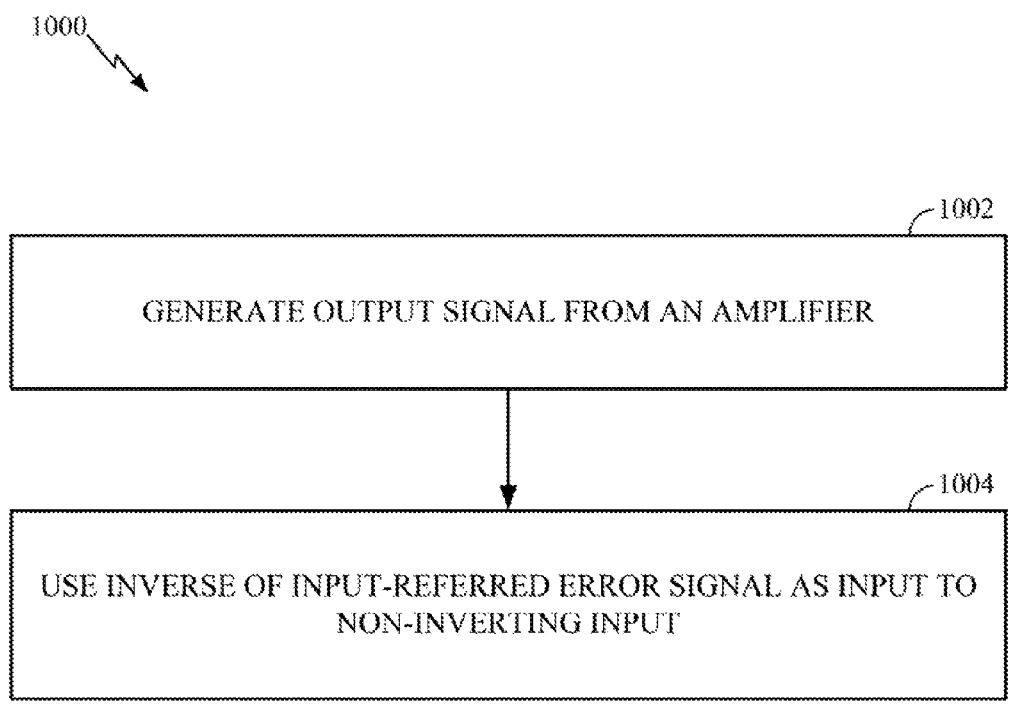
FIG. 10 illustrates example operations for an amplification system, in accordance with certain aspects of the present disclosure.

FIG. 10 illustrates example operations 1000 for an amplification system, in accordance with certain aspects of the present disclosure.

At 1002, an amplifier comprising differential inputs generates an output signal. The output signal comprises a sum of a nominal output signal and an output error signal, the output error signal being indicative of an error of the output signal with respect to the nominal output signal. The output error signal is based on an input-referred error signal associated with the amplifier. For example, the output error signal is based on the input-referred error signal with the gain of the amplifier applied. The signal at an inverting input of the amplifier may be indicative of the input-referred error signal.

At 1004, the input-referred error signal is inverted and used as an input into a non-inverting input of the amplifier.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An envelope tracking supply modulator comprising:
    an amplifier comprising an output, an inverting input, and a non-inverting input;
    a first node at the inverting input, wherein the first node is coupled to a feedback path from the output;
    a second node at the non-inverting input, wherein the second node is coupled to an inverting amplifier or buffer coupled to the first node, and wherein the second node is coupled to a reference voltage source; and a transconductance amplifier coupled to the first node, wherein the transconductance amplifier is configured to receive an input representing the envelope waveform of a signal.

2. The envelope tracking supply modulator of claim 1, further comprising a resistor and a capacitor coupled to the second node.

3. The envelope tracking supply modulator of claim 1, wherein the output of the amplifier is further coupled to a power amplifier in a transmit path.

4. The envelope tracking supply modulator of claim 1, wherein the amplifier comprises an operational amplifier.

5. An amplification system comprising:
   an amplifier comprising an output, an inverting input, and a non-inverting input;
   a feedback path from the output coupled to the inverting input, wherein the feedback path from the output is coupled to at least one of an inverting amplifier or buffer, an output of the at least one of the inverting amplifier or buffer being further coupled to the non-inverting input, and
   a path between the output of the at least one of the inverting amplifier or buffer and the non-inverting input, the path comprising a capacitor.

6. The amplification system of claim 5, wherein an input of the at least one of the inverting amplifier is coupled to the inverting input.

7. The amplification system of claim 5, wherein the amplifier comprises an operational amplifier.

8. A method for reducing error in an amplification system, the method comprising:
   generating, by an amplifier comprising an inverting input and a non-inverting input, an output signal comprising a sum of a nominal output signal and an output error signal, the output error signal being based on an input error signal of the amplifier;
   inverting the input error signal to generate an inverted input error signal;
   inputting the inverted input error signal to the non-inverting input; and
   generating the output signal based on an envelope waveform of a signal.

9. The envelope tracking supply modulator of claim 1, wherein the inverting input and the non-inverting input are differential inputs, and wherein the input representing the envelope waveform signal comprises differential input signals.

10. The amplification system of claim 5, wherein the inverting input and the non-inverting input are differential inputs.

* * * * *